United States Patent
Park et al.

(10) Patent No.: US 6,800,511 B2
(45) Date of Patent: Oct. 5, 2004

(54) METHOD FOR FABRICATING SEMICONDUCTOR DEVICE WITH NEGATIVE DIFFERENTIAL CONDUCTANCE OR TRANSCONDUCTANCE

(75) Inventors: Byung Gook Park, Seoul (KR); Jong Duk Lee, Seoul (KR); Kyung Rok Kim, Seoul (KR)

(73) Assignee: Seoul National University Industry Foundation, Seoul (KR)

( * ) Notice: Subject to any disclaimer, the term of this patent is extended or adjusted under 35 U.S.C. 154(b) by 0 days.

(21) Appl. No.: 10/614,666

(22) Filed: Jul. 7, 2003

(65) Prior Publication Data

US 2004/0097023 A1 May 20, 2004

(30) Foreign Application Priority Data

Jul. 6, 2002 (KR) ........................................ 2002-39146

(51) Int. Cl.[7] .............................................. H01L 21/84
(52) U.S. Cl. ........................ 438/151; 438/291; 438/962
(58) Field of Search .............................. 438/151, 164, 438/237, 291, 962, 979

(56) References Cited

U.S. PATENT DOCUMENTS

| | | | |
|---|---|---|---|
| 4,704,622 A | | 11/1987 | Capasso et al. ................ 257/25 |
| 4,959,696 A | | 9/1990 | Frensley et al. ............... 257/15 |
| 5,665,618 A | * | 9/1997 | Meyer et al. ................ 438/962 |
| 6,198,113 B1 | | 3/2001 | Grupp .......................... 257/39 |
| 6,294,412 B1 | * | 9/2001 | Krivokapic .................. 438/979 |
| 6,424,009 B1 | * | 7/2002 | Ju .............................. 257/347 |
| 6,673,717 B1 | * | 1/2004 | Brousseau, III ............. 438/962 |

* cited by examiner

Primary Examiner—Chandra Chaudhari
(74) Attorney, Agent, or Firm—Dilworth & Barrese LLP.

(57) ABSTRACT

The present invention relates to a method for fabricating semiconductor device with negative differential conductance or transconductance. According to the present invention, a fabrication process thereof can be simplified by using an SOI (Silicon-On-Insulator) substrate, and a tunneling device exhibiting the negative differential conductance or transconductance at room temperature can be implemented by using P+-N+ junction barriers as tunneling barriers and implanting impurity ions into a channel region so that their density is higher than the effective density of states where electrons or holes can exist thereon. Since the semiconductor device with the negative differential conductance or transconductance can be also be implemented even at room temperature, there is an advantage in that the present invention can be applied to an SRAM or a logic device using a device which can be turned on/off in response to a specific voltage.

Further, according to the fabrication method of the present invention. miniaturization of the device can be easily made, and the reproducibility and the mass productivity of the process can be enhanced. Simultaneously, the gate, the source/drain and the channel regions are formed by the self-aligned process. Thus, there is another advantage in that a gate pitch can also be reduced.

In addition, there is a further advantage in that the semiconductor device fabricated according to the present invention has the characteristic of a single electron transistor by using the channel region as the quantum dot and the two P+-N+ junctions as the tunneling barriers.

15 Claims, 15 Drawing Sheets

SOURCE/DRAIN IMPURITY IONS

SOURCE/DRAIN IMPURITY IONS

US 6,800,511 B2

METHOD FOR FABRICATING SEMICONDUCTOR DEVICE WITH NEGATIVE DIFFERENTIAL CONDUCTANCE OR TRANSCONDUCTANCE

BACKGROUND OF THE INVENTION

1. Field of the Invention

The present invention relates to a method for fabricating a semiconductor device with negative differential conductance or transconductance, and more particularly, to a method for fabricating a semiconductor device exhibiting negative differential conductance or transconductance at room temperature by using P+-N+ junction barriers, formed by implanting impurity ions into the channel region so that their density is higher than the effective density of states where electrons or holes can exist, and to fabrication processes thereof can be simplified by using an SOI (Silicon-On-Insulator) substrate.

2. Description of the Prior Art

Complementary metal oxide semiconductor (hereinafter, referred to as 'CMOS') devices have occupied most of the semiconductor markets as key elements of silicon semiconductor devices which have been continuously scaled down or miniaturized for the purpose of high performance and high integration thereof.

However, it is expected that such continuous miniaturization shall further aggravate problems related to quantum mechanics and statistical mechanics of the devices, and the operation and miniaturization thereof shall reach the limit in the near future due to these problems.

Accordingly, in order to overcome the limit resulting from the miniaturization of the CMOS devices, studies on new nano functional devices are required.

However, in virtue of a great advantage of the CMOS devices, they will continue to be used together with the new nano functional devices for a while. Thus, studies on hybrid integrated circuits should be continued.

Therefore, in view of the studies on the nano devices to be utilized in the near future, active studies on advanced or next generation nano functional devices based on silicon CMOS technologies have been made.

At present, a single electron transistor (SET), which is one of the nano functional devices proposed so far, is a device having the greatest potential for succeeding to metal oxide semiconductor field effect transistor (hereinafter, referred to as 'MOSFET').

Since movement of each electron can be adjusted at a lower voltage in the single electron transistor having a nanometer-scale quantum dot between two adjacent tunnel junctions, the single electron transistor can be driven at a lower power and the operation characteristic thereof can be improved according to the miniaturization of the device. Thus, there are advantages in that the SET has a potential for solving difficult problems involved in the existing classical devices and is the most compatible with the silicon based technology, as a current leading technology.

However, the SET should be able to be still operated at room temperature for its practical use. To this end, a technology for reproducibly forming quantum dots of several to several tens nm at desired points is required.

In addition to the single electron device, there is another device using quantum mechanical tunneling at a junction, which is a silicon device serving as the nano functional device.

FIG. 1 shows a basic structure of a device using a silicon tunnel junction and an energy band of the device in a thermal equilibrium state. The device was proposed by L. Esaki in Japan in 1976 for the first time. However, since the Esaki's tunnel junction device is basically a two-terminal device, the device has a problem in view of the active operation thereof.

FIG. 2 is a graph showing the current-voltage characteristic of the device shown in FIG. 1. If N-type and P-type silicons, each of which has a high density of impurity ions, are joined with each other and a voltage applied thereto is increased in the forward direction, the device exhibits a characteristic of negative differential conductance or transconductance. Further, the device has an advantage in that the characteristic of negative differential conductance or transconductance can be realized even at room temperature regardless of its size.

FIG. 3 is a perspective view of a conventional silicon surface junction tunneling device. A buried oxide film 11 is formed on a silicon substrate 10, and source 12 and drain 13 are formed in such a manner that they are spaced apart from each other on the buried oxide film 11.

A gate 16 is formed on the drain 13 with a gate oxide film 15 interposed therebetween. Thus, the device is in the form of a three-terminal active device, in which an inversion layer, i.e. a channel 14 is formed between the N+ source 12 and the P+ drain 13 when a gate voltage Vg is applied to the gate.

Reference numeral '17' in the figure designates a field oxide film.

FIG. 4 is a graph showing the characteristic of differential conductance or transconductance with respect to the drain voltage of the device shown in FIG. 3. Particularly, this figure shows the characteristic of negative differential conductance or transconductance at room temperature.

In case of the three-terminal silicon surface junction tunneling device, impurity ions having opposite polarities should be implanted into the source and drain, respectively. Thus, the process becomes complex and there has been a difficulty in miniaturizing the device.

In the meantime, the methods of fabricating the single electron transistors, which have been made public heretofore, have been implemented through an accidental method for its operation at room temperature, i.e. using of the polysilicon grain, the ununiformity of E-beam lithography, or the potential variation depending on undulation of a thin SOI film of several nm. However, they have the problem of poor reproducibility.

Further, a method of fabricating the single electron transistor by an atomic force microscope (AFM) or a scanning tunneling microscope (STM) has a slow process rate, lacking suitability for mass production.

Moreover, although the method of forming quantum dots by using an oxidation process depending on a pattern has no problems in reproducibility and mass production, there have been disadvantages in that the single electron transistor with the quantum dot formed therein operates only at a lower temperature of about 40 K, and it is difficult to reduce the area occupied by the whole device due to a relatively large upper gate and side electrodes, which are not in a self-aligned structure.

SUMMARY OF THE INVENTION

Accordingly, the present invention is made to solve the above problems in the prior art. An object of the present invention is to provide a method for fabricating a semiconductor device with negative differential conductance or transconductance at room temperature by using P+-N+ junction barriers, formed by implanting impurity ions into the channel region so that their density is higher than the effective density of states where elections or holes can exist, and to fabrication processes thereof can be simplified by using an SOI (Silicon-On-Insulator) substrate.

Another object of the present invention is to provide a method for fabricating a semiconductor device wherein the characteristics of a single electron transistor can be obtained by using a channel region as a quantum dot and two P+-N+ junctions existing between source and drain regions and the channel region as tunneling barriers.

According to an aspect of the present invention for accomplishing the objects, there is provided a method for fabricating a semiconductor device with negative differential conductance or transconductance, which comprises a first step of etching a single crystal silicon layer of an SOI substrate consisting sequentially of a silicon support, a buried oxide film and the single crystal silicon layer so as to form source and drain regions which are spaced apart from each other and a channel region which is connected with the source and drain regions and has a fine line width; a second step of implanting impurity ions into the source, channel and drain regions with their density being higher than the effective density of states at which electrons or holes can exist so that the channel region is doped with the impurity ions; a third step of forming a first insulation film on the source, channel, drain regions and the buried oxide film, and etching the first insulation film so as to form sidewall spacers on side surfaces of the source, channel and drain regions, and then forming a second insulation film on the exposed silicon surface including the source, channel and drain regions so as to form a gate insulation film on the channel region; a fourth step of depositing a gate material on the entire surface including the second insulation film and forming a gate having a fine line width in a direction normal to the channel region by etching the deposited gate material; and a fifth step of implanting impurity ions, having opposite polarity to that of the impurity ions implanted in the second step, into the source and drain regions.

According to another aspect of the present invention for accomplishing the objects, there is provided a method for fabricating a semiconductor device with negative differential conductance or transconductance, which comprises a first step of etching a single crystal silicon layer of an SOI substrate consisting sequentially of a silicon support, a buried oxide film and the single crystal silicon layer so as to form source and drain regions which are spaced apart from each other and a channel region which is connected with the source and drain regions and has a fine line width; a second step of implanting impurity ions into the source, channel and drain regions with their density being higher than the effective density of states at which electrons or holes can exist so that the source and drain regions are doped with the impurity ions; a third step of forming a first insulation film on the source, channel, drain regions and the buried oxide film, and etching the first insulation film so as to form sidewall spacers for covering side surfaces of the source, channel and drain regions; a fourth step of depositing a second insulation film on the entire surface including the source, channel and drain regions, the first insulation film and the buried oxide film, and exposing the channel region by etching the second insulation film in a direction normal to the channel region; a fifth step of implanting impurity ions, having opposite polarity to that of the impurity ions implanted in the second step, into the channel region with their density being higher than the effective density of states; and a sixth step of depositing a gate insulation film on the channel region and forming a gate by depositing a gate material on the channel region and the gate insulation film.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE INVENTION

Hereinafter, preferred embodiments of the present invention will be described with reference to the accompanying drawings.

EMBODIMENT 1

Figure 1:
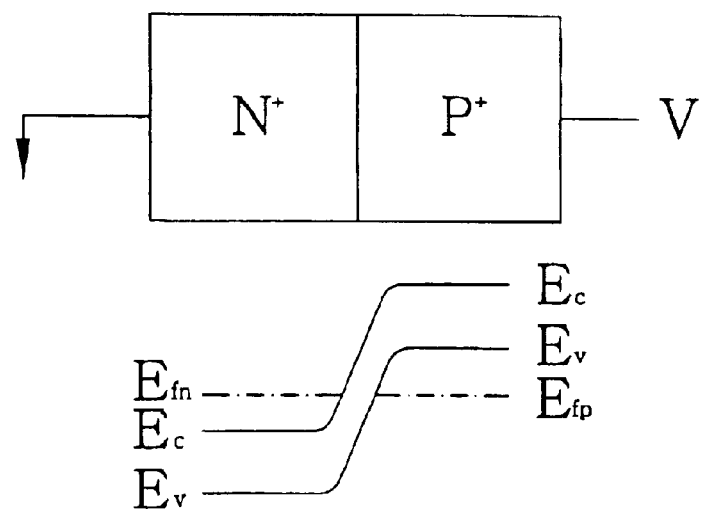
FIG. 1 is a view showing the basic structure of a device using a silicon tunnel junction and an energy band thereof in a thermal equilibrium state.
Figure 2:
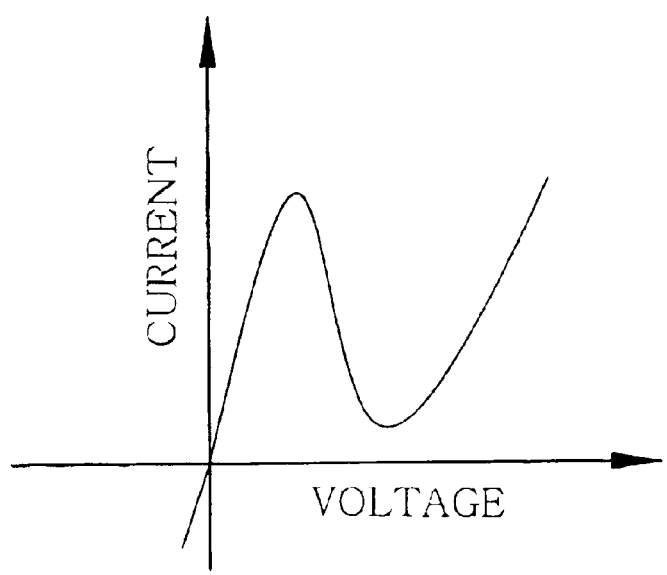
FIG. 2 is a graph showing a current-voltage characteristic of the device shown in FIG. 1.
Figure 3:
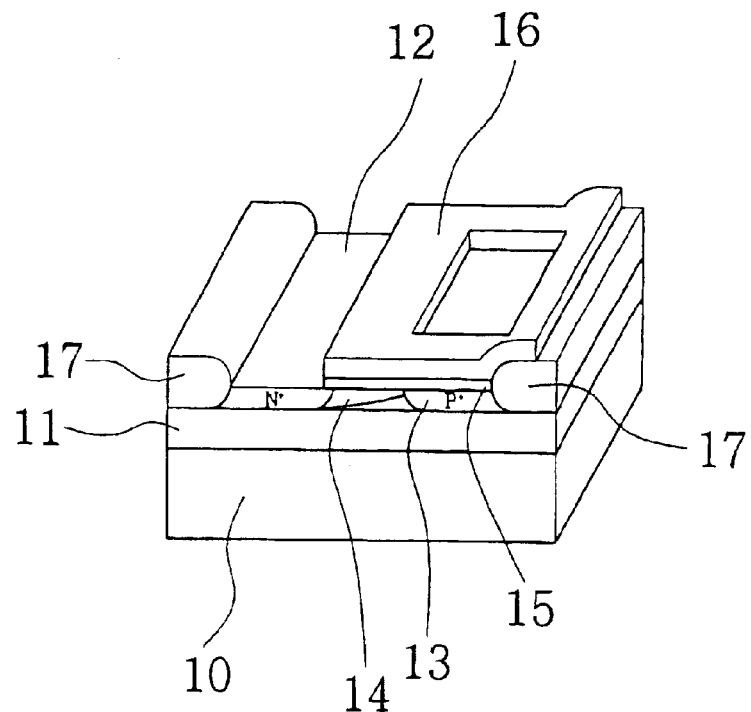
FIG. 3 is a perspective view of a conventional silicon surface junction tunneling device.
Figure 4:
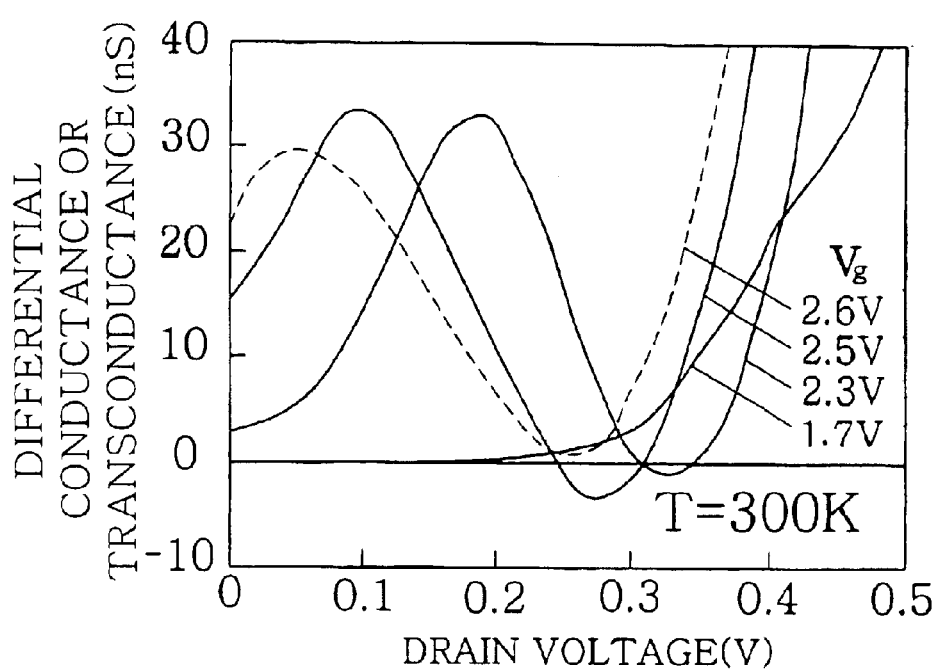
FIG. 4 is a graph showing a characteristic of differential conductance or transconductance of the device shown in FIG. 3 with respect to a drain voltage thereof.
Figure 5A:
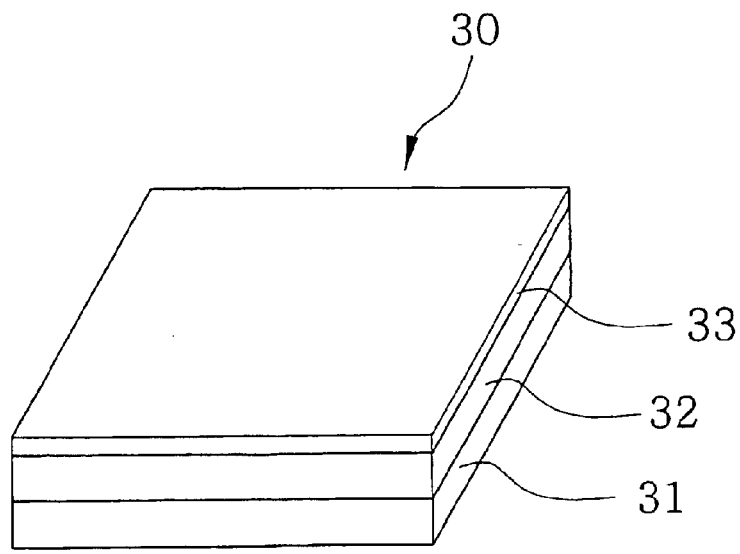
FIGS. 5a to 5h are perspective views showing sequential processes of fabricating a semiconductor device with negative differential conductance or transconductance according to a first embodiment of the present invention.

FIGS. 5a to 5h are perspective views showing sequential processes of fabricating a semiconductor device with negative differential conductance or transconductance according to a first embodiment of the present invention. As shown in FIG. 5a, an SOI (Silicon on Insulator) substrate consisting sequentially of a silicon support 31, a buried oxide film 32 and a single crystal silicon layer 33 is first prepared.

Figure 5B:
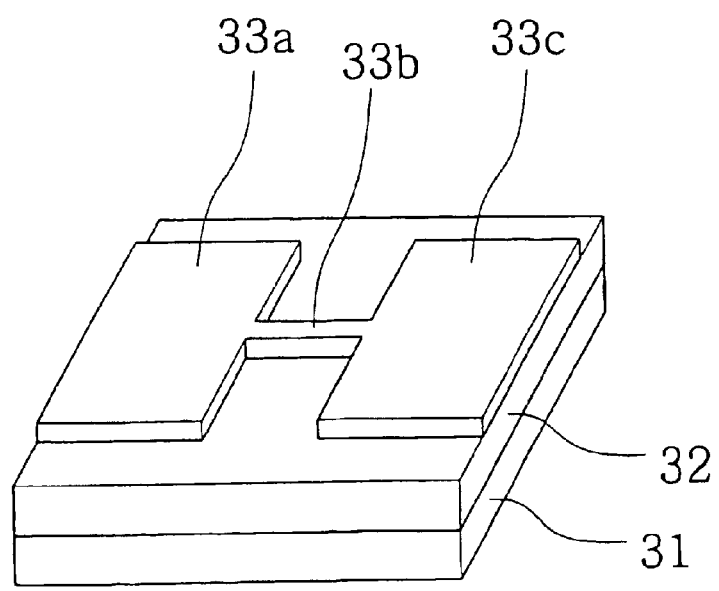

The single crystal silicon layer 33 is then etched off with an E-beam lithography method or a fine patterning technique using sidewalls so that a source region 33a, a channel region 33b with a fine line width, and a drain region 33c are formed (see FIG. 5b).

Figure 5C:
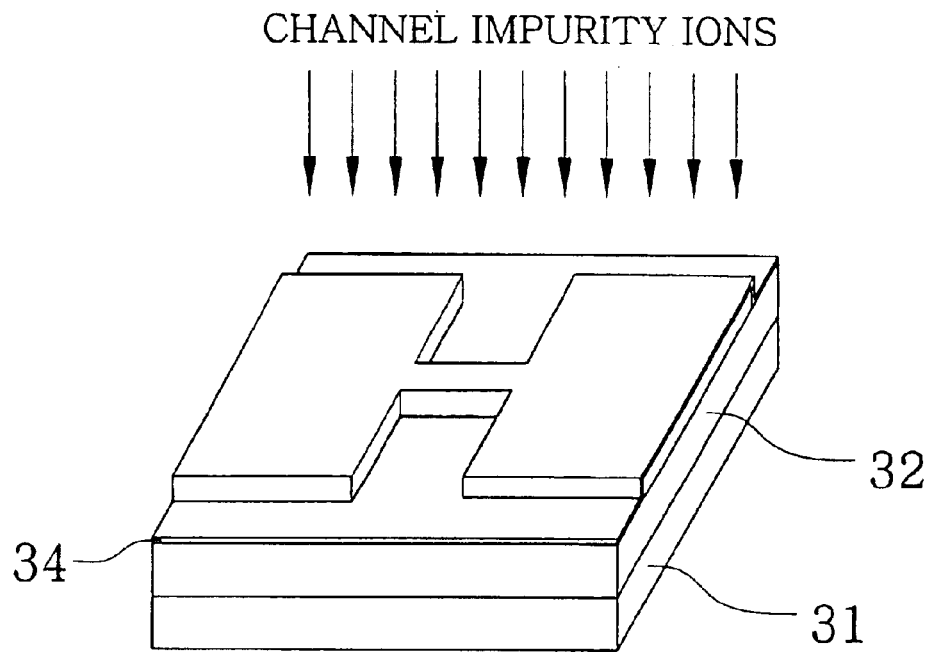

After a sacrificial oxide film 34 having the thickness of about 50 Å is formed on the entire surface including the source, channel and drain regions 33a to 33c and impurity ions are implanted on the entire surface with their density being higher than the effective density of states at which electrons or holes can exist so that the channel region 33b is doped with the impurity ions (see FIG. 5c).

Since each of the source, channel and drain regions 33a to 33c is formed to be stepped at the height of 400 Å above from the buried oxide film 32, the sacrificial oxide film 34 having the thickness of 50 Å can prevent any damage to the source, channel and drain regions 33a to 33c due to the implantation of the impurity ions thereon.

As the effective density of states of silicon are $1.08 \times 10^{19}/cm^3$ in valence band and $2.8 \times 10^{19}/cm^3$ in conduction band, impurity ions having the density equal to or greater than $1 \times 10^{20}/cm^3$ are implanted into the channel region 33b.

Implanted ions are P-type impurity ions such as B, $BF_2^+$ and In for forming a P-type channel region, and N-type impurity ions such as $As_2^+$, As and P for forming a N-type channel region.

Figure 5D:
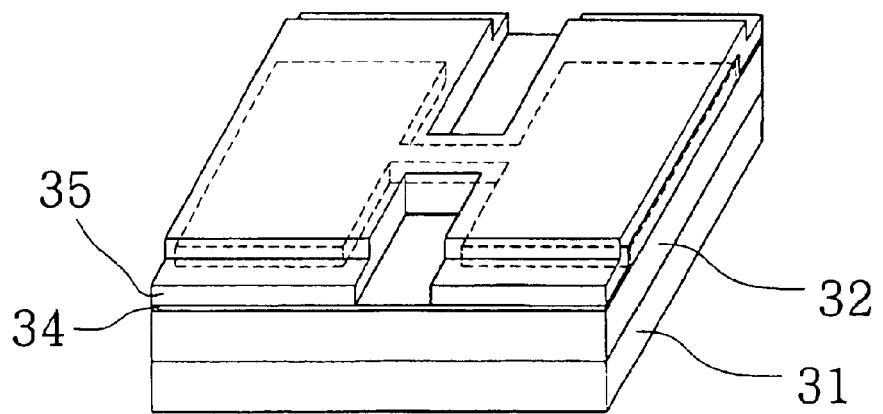

A first insulation film 35 is then formed on the sacrificial oxide film 34 to have a thickness of 600 Å so that the first insulation film 35 fully covers the source, channel and drain regions 33a to 33b and the buried oxide film 32 (see FIG. 5d).

Figure 5E:
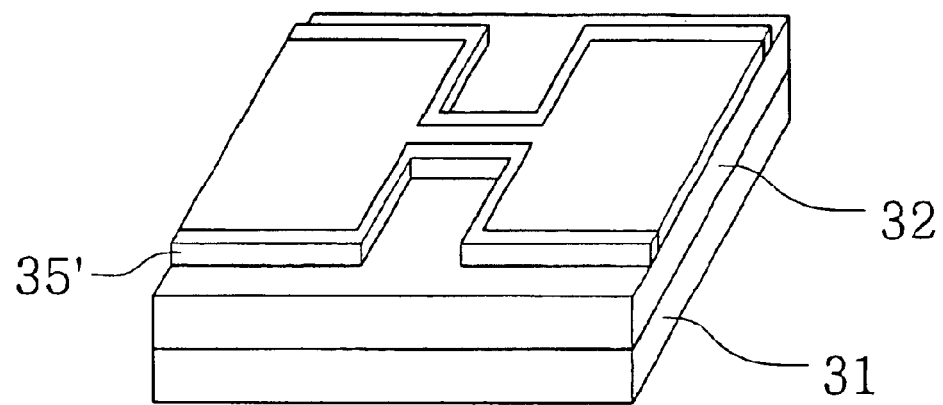

Next, the first insulation film 35 is etched so that sidewall spacers 35' are formed on side surfaces of the channel region 33b (see FIG. 5e).

At this time, since the first insulation film 35 is removed so that the source, channel and drain regions 33a to 33c are exposed but their side surfaces are still covered, no gate insulation film will be formed on the channel region 33b.

Thereafter, a second insulation film is formed on entire surface including the source, channel and drain regions 33a to 33c and the sidewall spacers 35'. Thus, a gate insulation film 36 is formed on the channel region 33b (see FIG. 5f).

Figure 5F:
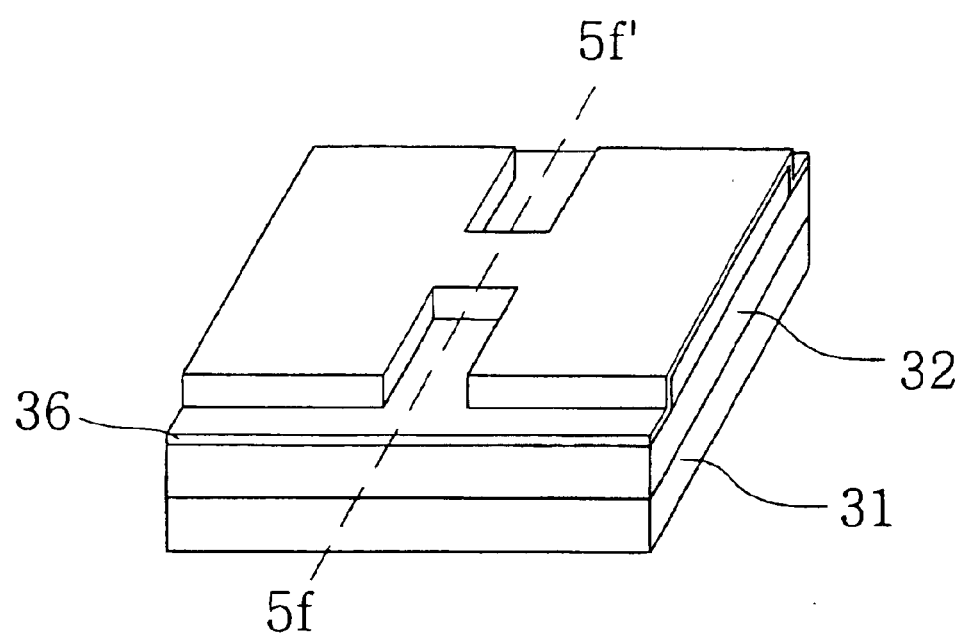
Figure 6:
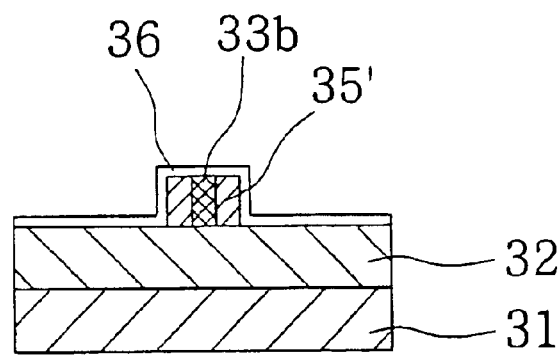
FIG. 6 is a sectional view taken along the line 5f–5f' in FIG. 5f.

If the processes of FIGS. 5e and 5f are performed, sidewall spacers 35' are formed on the side surfaces of the channel region 33b and the gate insulation film 36 is formed on the channel region 33b, as shown in FIG. 6 which is a sectional view taken along the line 5f-5f in FIG. 5f.

The gate insulation film 36 covers top surfaces of the source, channel and drain regions 33a to 33c.

Figure 5G:
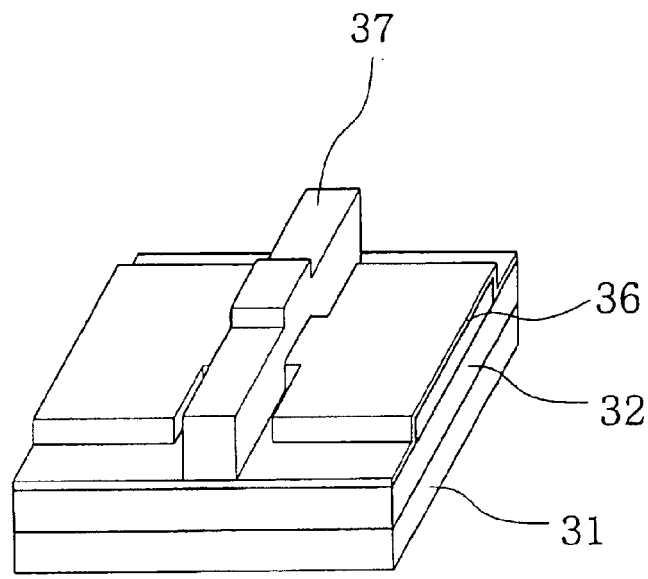
Figure 5H:
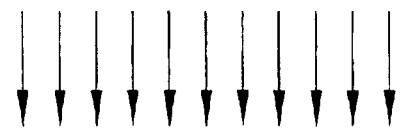
Figure 5H:
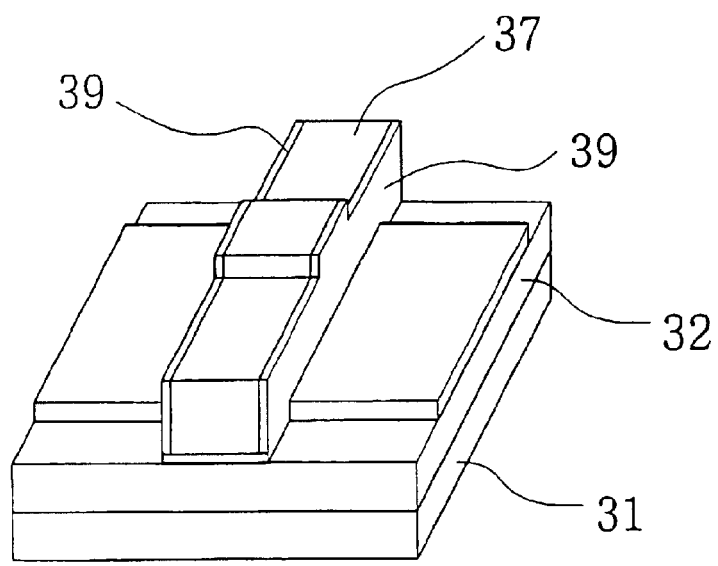

As shown in FIG. 5g, a gate material is deposited on the entire surface including the top surface of the second insulation film and the deposited gate material is removed with an E-beam lithography method or a fine patterning technique using sidewalls. Thus, a gate 37 having a fine line width in a direction normal to the channel region 33b is formed.

Here, the gate material to be deposited is polycrystalline or amorphous silicon.

Finally, a third insulation film is formed on the entire surface including the gate insulation film 36 and the gate 37, and the third insulation film is then etched. Thus, side spacers 39 are formed on all side surfaces of the gate 37. Thereafter, impurity ions are implanted into the entire surface so that the impurity ions are implanted into the source and drain regions 33a, 33c by a self-aligned process (see FIG. 5h).

It is preferable that the first, second and third insulation film are made of one material selected from a group consisting of $SiO_2$ and $SiN$.

As described before, implanted ions are the N-type impurity ions such as $As_2^+$, As and P for forming the N-type channel region and the P-type impurity ions such as B, $BF_2^+$ and In for forming the P-type channel region.

Accordingly, if the channel region has been doped with the P-type impurity ions, the source/drain regions should be doped with the N-type impurity ions.

According to the first embodiment of the present invention, since the sidewall spacers 35' are formed of the insula on film on the side surfaces of the channel region having a fine line width, there are advantages in that a step coverage can be small when the gate 37 is formed perpendicularly to the channel region and capacitance of the gate can also be reduced.

Further, if the line width of the gate 37 is sufficiently wide, impurity ion implantation for forming each of the source/drain regions 33a, 33c can be performed without forming the sidewall spacers 39 on the entire side surfaces of the gate 37.

EMBODIMENT 2

In the first embodiment of the present invention, after the impurity ions are first implanted into the channel region 33b and the gate 37 having a fine line width are formed, the impurity ions are then implanted into the source/drain regions 33a, 33c. In this embodiment, the impurity ions implanted into the source/drain regions 33a, 33c may be overly and laterally diffused in the thermal process for activation of the impurity ions, inviting a problem that the impurity ions in the source/drain regions may encroach the channel region 33b.

In order to solve this problem, the order of implanting the impurity ions into the channel and source/drain regions is changed in the second embodiment of the present invention.

FIGS. 7a to 7f are perspective views showing sequential processes of fabricating a semiconductor device with negative differential conductance or transconductance according to the second embodiment of the present invention.

Figure 7A:
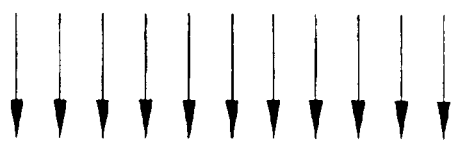
FIGS. 7a to 7f are perspective views showing sequential processes of fabricating a semiconductor device with negative differential conductance or transconductance according to a second embodiment of the present invention.
Figure 7A:
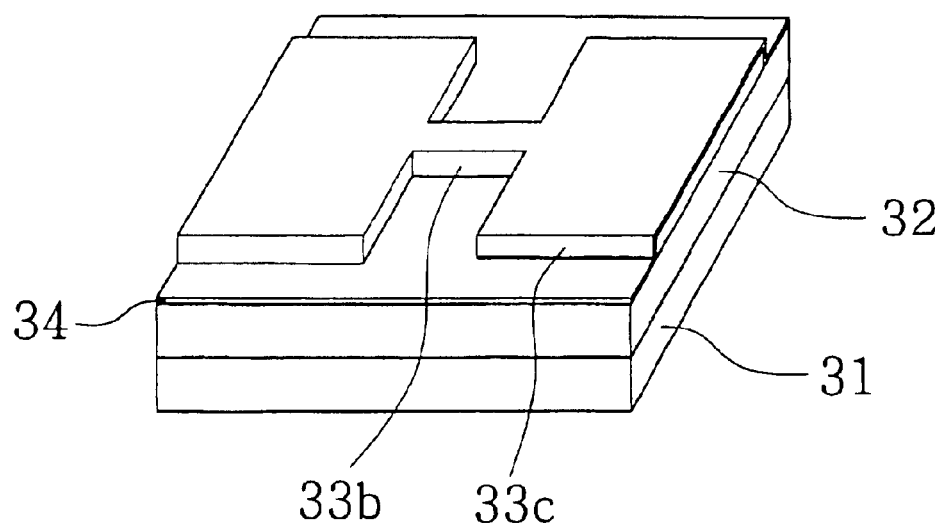

After performing the process of FIG. 5c (that is, after forming the sacrificial oxide film 34), impurity ions are implanted into the entire surface with their density being higher than the effective density of states at which electrons or holes can exist so that the source/drain regions 33a, 33c can be doped with the impurity ions, as shown in FIG. 7a.

Similarly to the implantation of the impurity ions in the embodiment 1, N-type impurity ions such as $As_2^+$, As and P are implanted for forming N-type source/drain regions and P-type impurity ions such as B, $BF_2^+$ and In for forming P-type source/drain regions.

Figure 7B:
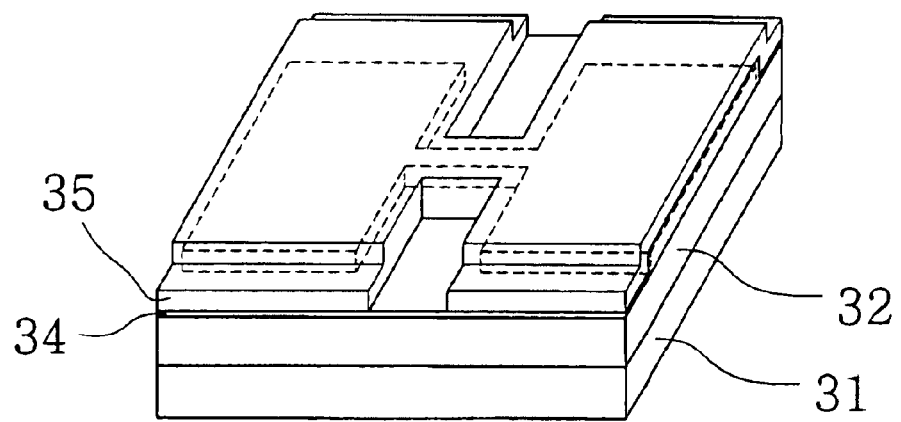

The first insulation film 35 is then formed on the entire surface including the source, channel and drain regions 33a to 33c and the buried oxide film 32 (see FIG. 7b).

Figure 7C:
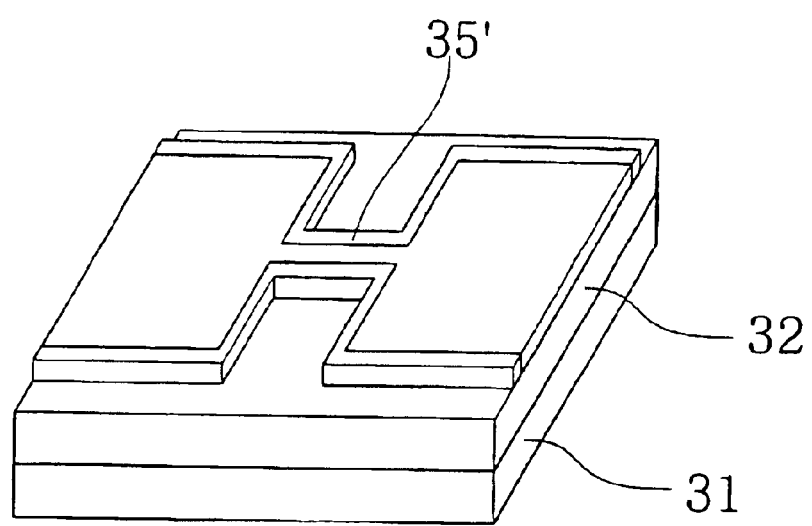

Thereafter, a first insulation film 35 is etched off so that the sidewall spacers 35' are formed on the side surfaces of the channel region 33b (see FIG. 7c).

At this time, the first insulation film 35 is removed so that the source, channel and drain regions 33a to 33c are exposed but their side surfaces are not exposed. Thus, no gate insulation film will be formed on the channel region 33b.

Here, the sacrificial oxide film 34 can remain on the source, channel and drain regions 33a to 33c depending on the process.

Further, a second insulation film 42 is deposited on the entire surface including the source, channel and drain regions 33a to 33c, the sidewall spacers 35' and the buried oxide film 32. The second insulation film 42 is then etched with an E-beam lithography method or a fine patterning technique using sidewalls. Thus, the second insulation film 42 is removed by a portion corresponding to the gate size of the device in a direction normal to the channel region, and the impurity ions are implanted into a portion opened through the etching process with their density being higher than the effective density of states at which electrons or holes can exist so that the channel region 33b is doped with the impurity ions (see FIG. 7d).

The P-type impurity ions such as B and $BF_2^+$ are implanted for forming the P-type channel region and the N-type impurity ions such as $As_2^+$, As and P for forming the N-type channel region.

Source/drain regions 33a, 33c are formed by the self-aligned process with the fine channel region 33b interposed therebetween.

Figure 7D:
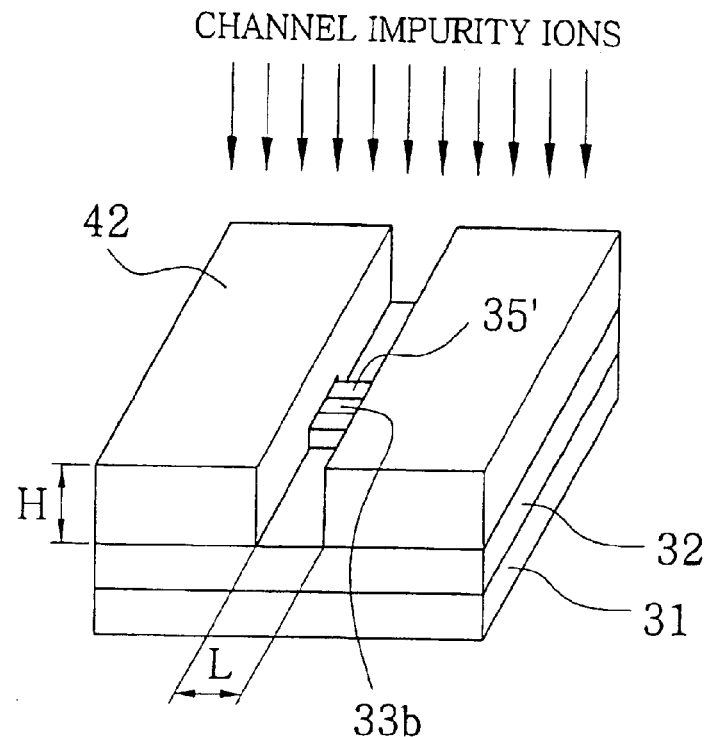
Figure 7E:
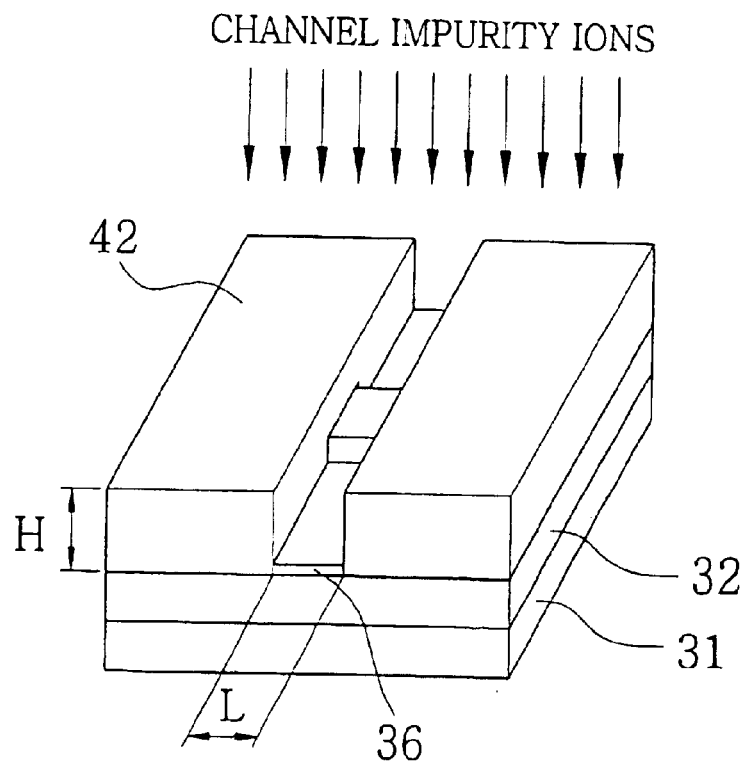
Figure 7F:
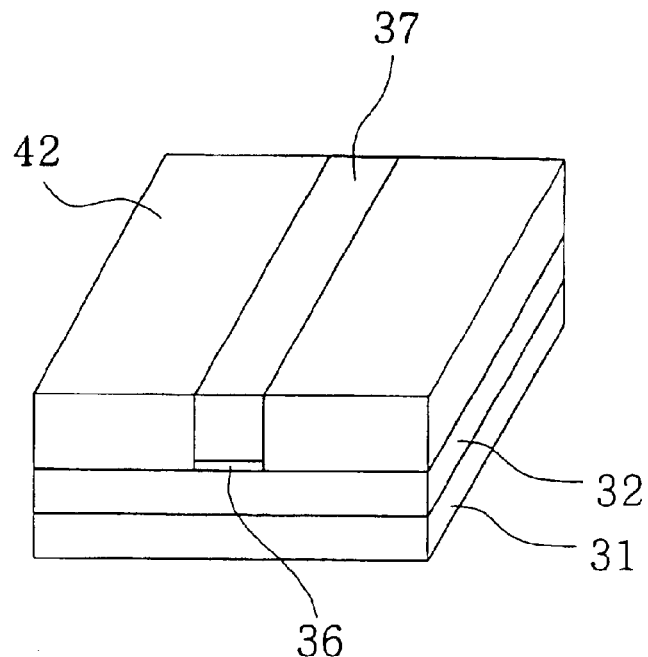

Thereafter, a gate insulation film 36 is caused to grow on the channel region 33b in the state of FIG. 7d(see FIG. 7e).

Finally, a gate 37 is formed by depositing the gate material on the entire surface and then planarizing the entire surface through an etch-back process or a chemical mechanical polishing (CMP) process. Thus, a device with negative differential conductance or transconductance according to the second embodiment of the present invention is fabricated (see FIG. 7f).

Referring to FIG. 7d, if the height H of the depressed portion formed by the finsulation film 42 is suffiently greater than the length L of the channel, the gate material can remain in the already-formed depressed portion by the self-aligned process, even if the gate material on the entire surface is etched without any mask.

As the impurity ions (for example, P-type impurity ions) are implanted into the channel region as well as the source/drain regions in the process of FIG. 7a. Thus, those impurity ions (P-type impurity ions) remain in the channel region as well as in the source/drain regions.

Accordingly, when the impurity ions (for example, N-type impurity ions) are implanted into the channel region in the process of FIG. 7d, the amount of the N-type impurity ions should be sufficient enough to cancel out the remaining P-type impurity ions and to activate the cannel region.

In the meantime, in the present invention, additional sidewall spacers in the form of the insulation film may be formed on the depressed portion of the insulation film before the ion implantation process for forming the channel region with the impurity ions implanted therein, in addition to the sidewall spacers around the channel region, in order to reduce the gate capacitance.

The operation of the device fabricated as above will be described with reference to the accompanying drawings.

Figure 8:
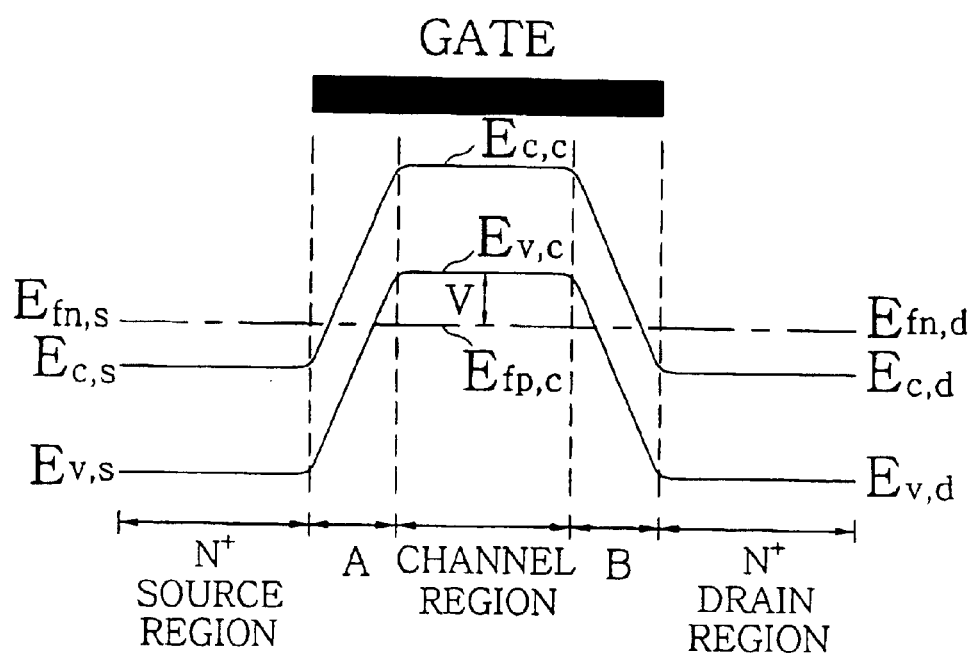
FIG. 8 is an energy band diagram in a thermal equilibrium state of a semiconductor device with negative differential conductance or transconductance having a P-type channel region and N-type source/drain regions according to the present invention without any voltage applied thereto.

FIG. 8 is an energy band diagram in a thermal equilibrium state where any voltage is not applied to a semiconductor device with negative differential conductance or transconductance having the P-type channel region and the N-type source/drain regions according to the present invention.

The channel region and the source/drain regions are of semiconductor materials having the energy band gap. Since carriers having a density greater than the effective density of states are implanted into the channel region, the Fermi energy level $E_{fp,c}$ is positioned below the valence band energy level $E_{v,c}$ of the channel region, creating the empty energy state V.

Figure 9A:
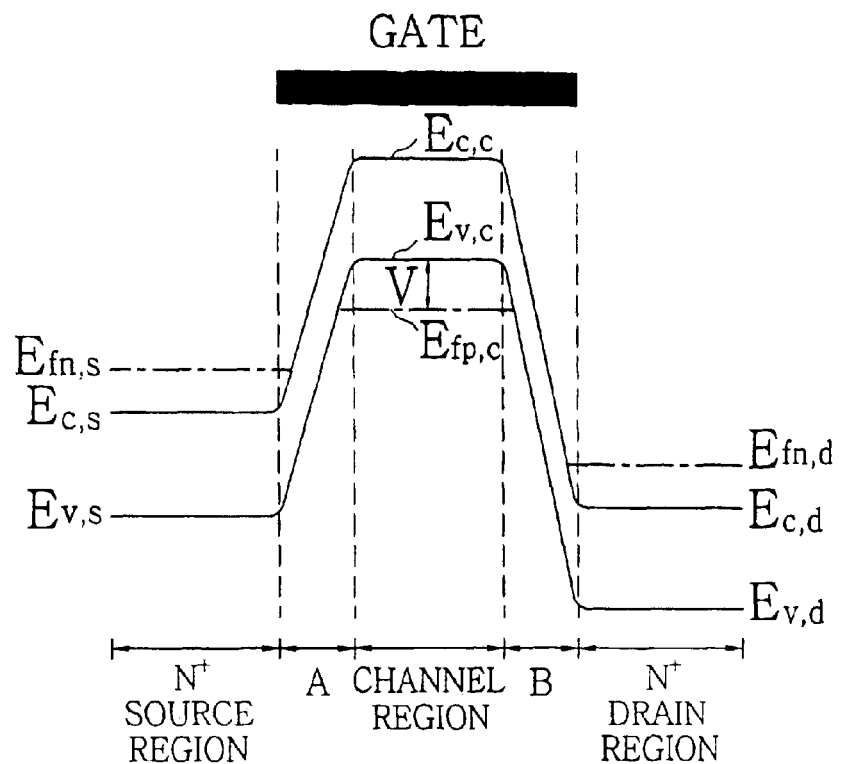
FIGS. 9a to 9e are energy band diagrams in a state where the semiconductor device with negative differential conductance or transconductance of FIG. 8 acts as a tunneling device.
Figure 9B:
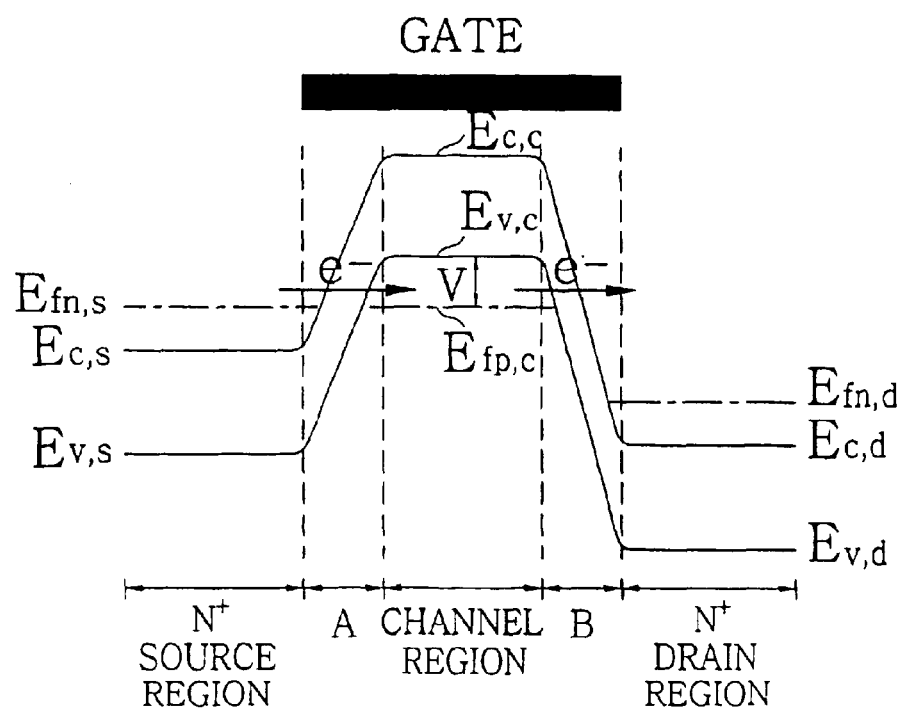
Figure 9C:
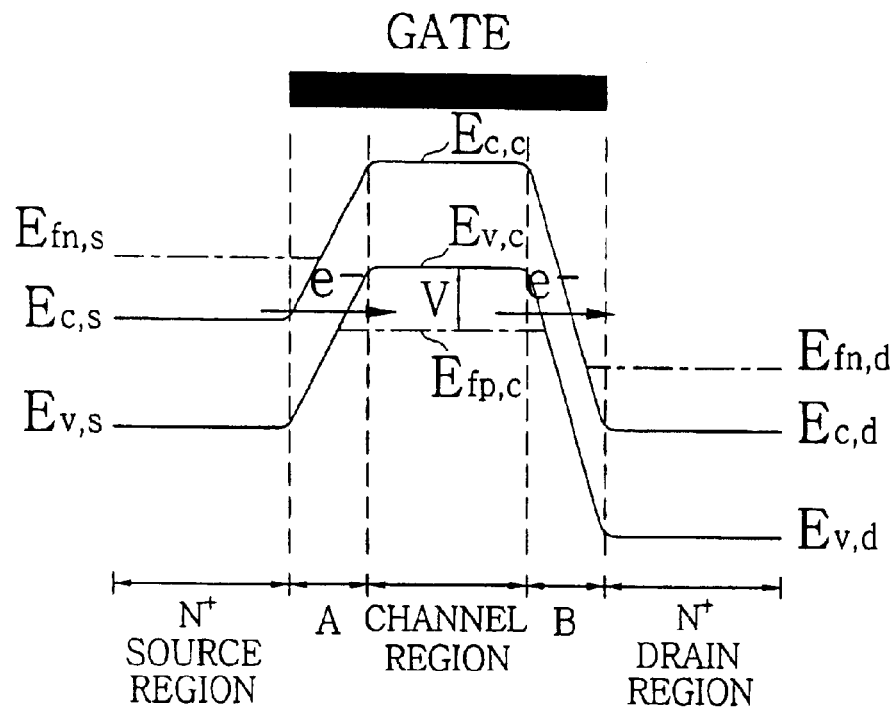
Figure 9D:
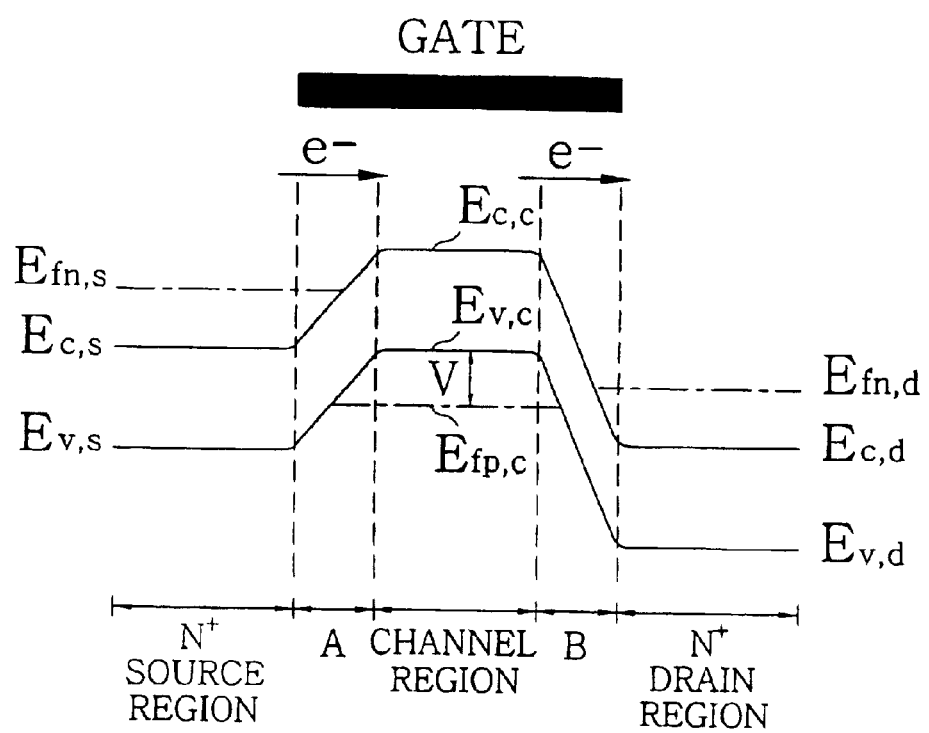
Figure 9E:
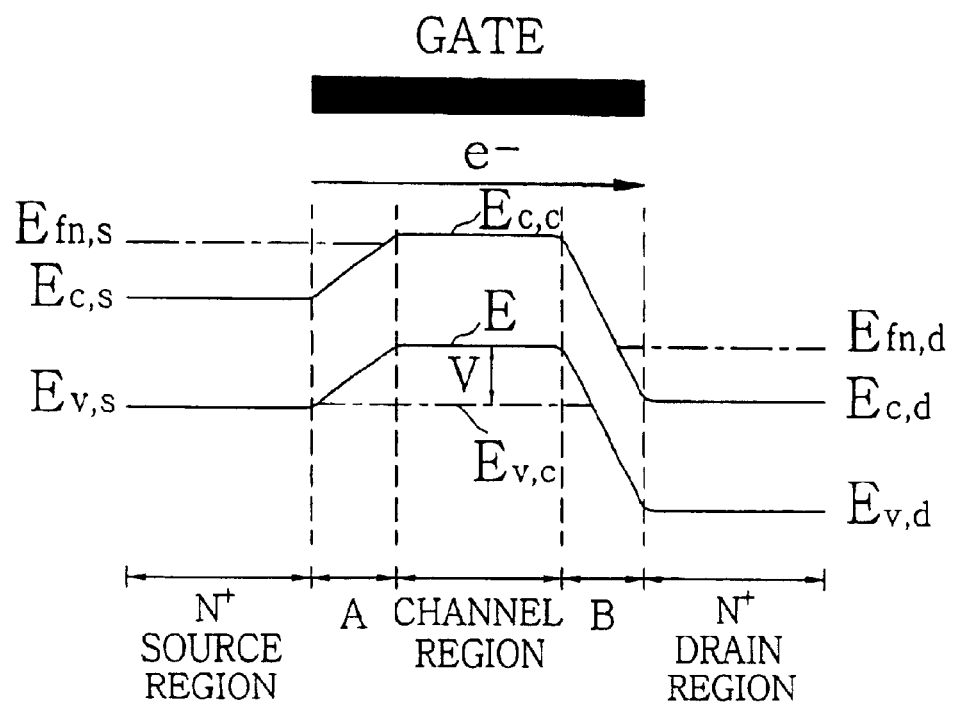

FIGS. 9a to 9e are energy band diagrams in a state where the semiconductor device with negative differential conductance or transconductance of FIG. 8 acts as a tunneling device. As shown in FIG. 9a, in a case where a gate voltage is negat e, the electrons cannot move across the channel region with the energy levels lower than the Fermi energy level $E_{fp,c}$ of the channel region even if electrons in the source region pass through the source tunnel junction A. Thus, the electrons in the source region cannot tunnel across the gate and no drain current flows(see FIG. 10).

If the gate voltage (the gate voltage '41' in FIG. 10) is applied so that the Fermi energy level $E_{fn,s}$ of the source region and the Fermi energy level $E_{fp,c}$ of the channel region are equal to each other, the electrons in the source region start to pass through the channel region and move toward the drain region. Thus, a tunneling current begins to flow (see FIG. 9b).

If the higher gate voltage (the gate voltage '42' in FIG. 10) is applied, the Fermi energy level $E_{fp,c}$ of the channel region becomes lower than the Fermi energy level $E_{fn,s}$ of the source, the electrons in the source region are aligned through with the empty energy state V below the valence band energy level of the channel region. As the result, the electrons in the source region smoothly tunnel into the channel region and then move toward the drain region, causing the maximum drain current to flow(see FIG. 9c).

If the gate voltage (the gate voltage '43' in FIG. 10) is further increased(see FIG. 9d), the electrons in the source region confront the forbidden energy gap in the channel region, making tunneling hard to occur, and only the thermally activated electrons move over a conduction band energy level of the channel region toward the drain region. Thus, the number of the electrons moving from the source region to the drain region becomes small, resulting in the reduced drain current.

Thereafter, if the gate voltage is still further increased (the gate voltage '44' in FIG. 10), the drain current increases again as the electrons are collected at the inversion layer due to the operation of MOSFET.

Figure 10:
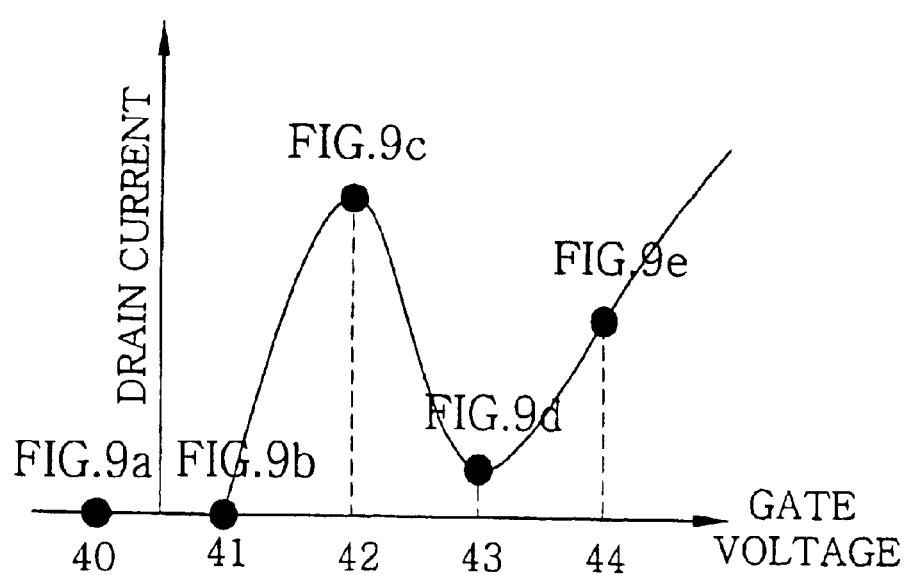
FIG. 10 is a schematic view showing a drain current generated when a gate voltage is caused to be increased, in connection with FIGS. 9a to 9e.

FIG. 10 is a schematic view showing the drain current generated when the gate voltage is increased in connection with FIGS. 9a to 9e, in which each of the drain currents with respect to the five different gate voltages in FIGS. 9a to 9e is denoted as a dot.

Figure 11:
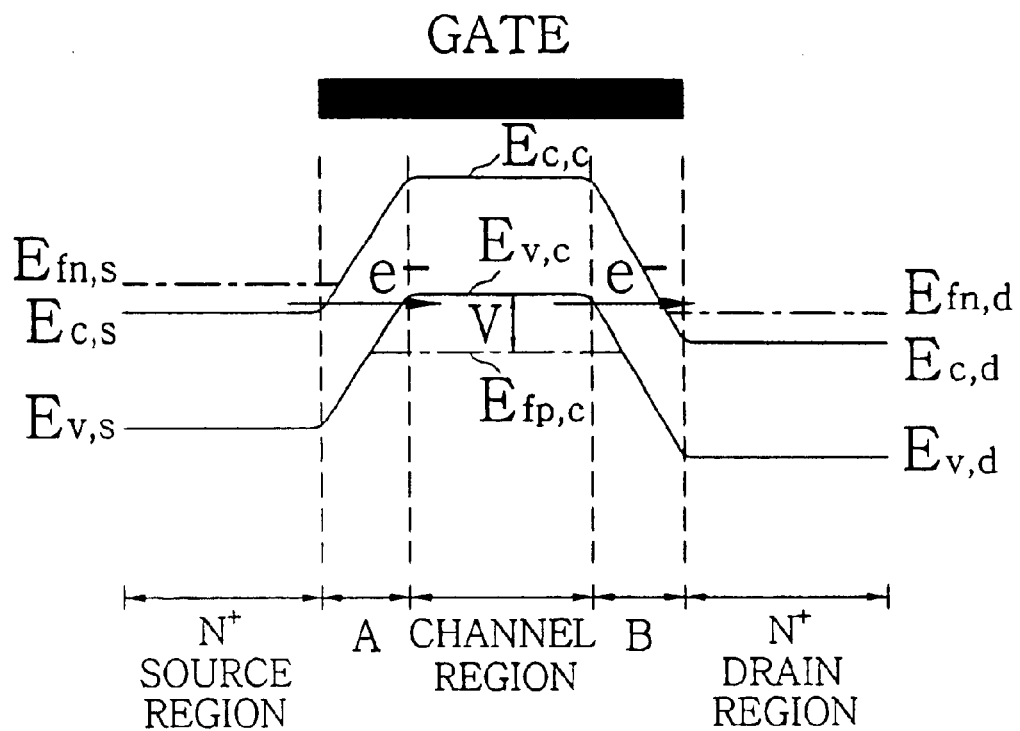
FIG. 11 is an energy band diagram when a low drain voltage is applied to a semiconductor device with negative differential conductance or transconductance having reduced length and width of the gate thereof.
Figure 12:
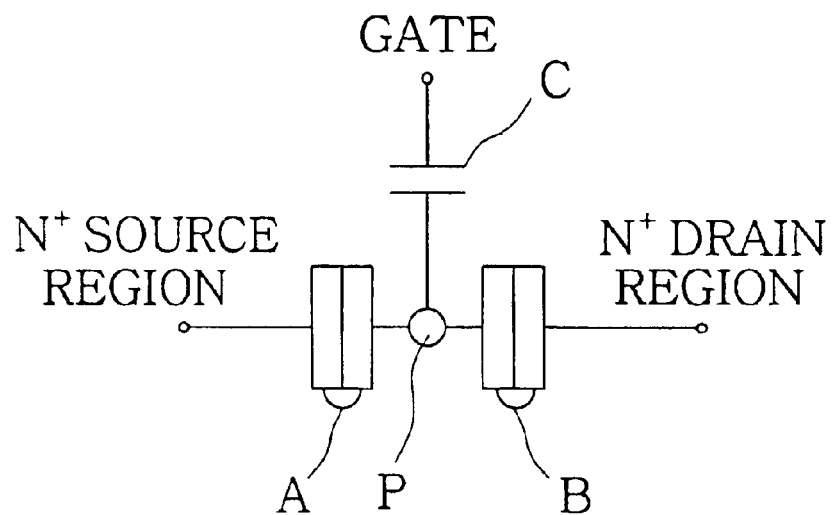
FIG. 12 is a schematic view of the semiconductor device of FIG. 11, which has been implemented into a single electron transistor.

FIG. 11 is an energy band diagram when a small drain voltage is applied to a semiconductor device having the gate of the reduced length and width with negative differential conductance or transconductance; and FIG. 12 is a schematic view of the miconductor device of FIG. 11, which is implemented into a single electron transistor. In the above semiconductor device structures, the P+-N+ junctions between the channel and source/drain regions serve as source and drain tunnel junctions A, B of the single electron transistor, respectively. Further, the fine channel region existing between the two tunnel junctions serves as a quantum dot P. Since the gate insulation film, having a gate capacitance C, exists between the gate defined with a fine line width and the channel region, the gate can regulate the potential of the quantum dot P.

It is an advantage that the semiconductor device of the present invention serves as the single electron transistor.

Further, in the semiconductor device with negative differential conductance or transconductance according to the present invention, the channel region can be formed to be smaller than the length of the actual gate, since the junctions between the source/drain and channel regions are used as the tunneling junctions. Moreover, much smaller quantum dots can be formed due to the width of the depletion area which is inherently generated at the junctions. Thus, the present invention has another advantage in that the operation temperature of the single electron transistor can be enhanced.

Figure 13:
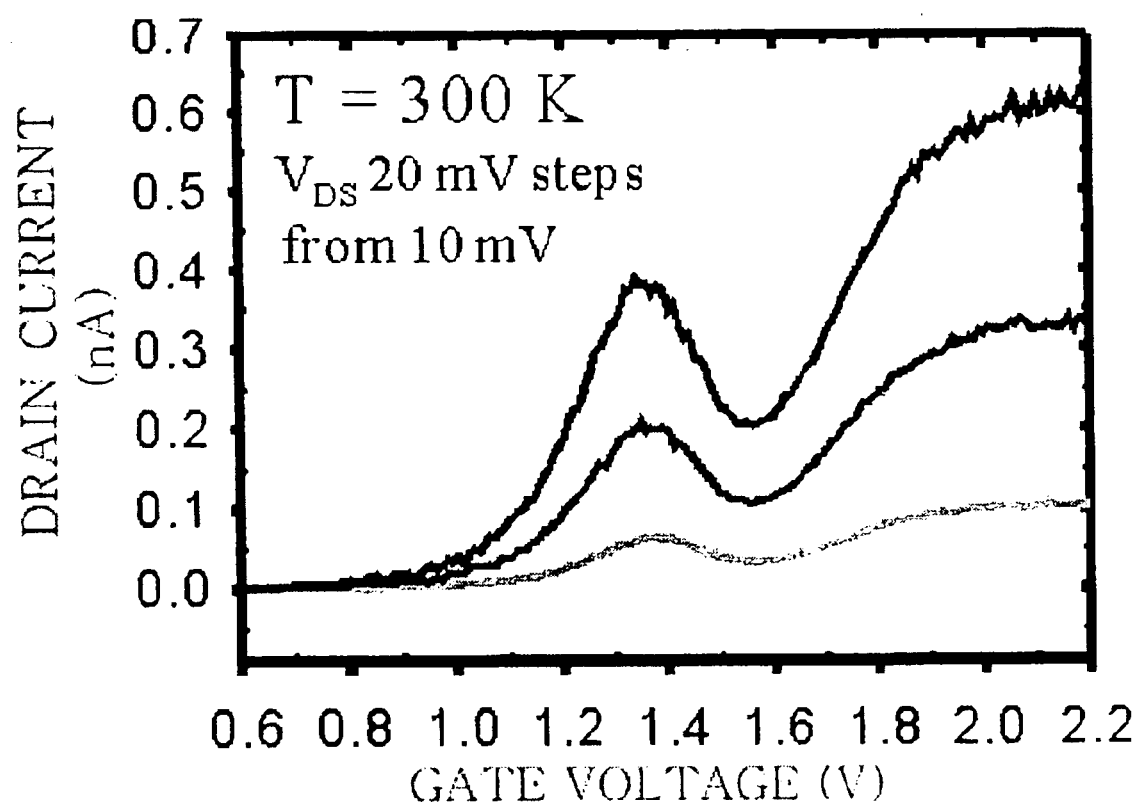
FIG. 13 is a graph showing the characteristic of the drain current in response to the gate voltage of the semiconductor device with negative differential conductance or transconductance according to the present invention.

FIG. 13 is a graph showing the characteristic of a drain current in response to the gate voltage of the semiconductor device with negative differential conductance or transconductance according to the present invention. A device having the P-type channel region and the N-type source/drain regions fabricated according to the present invention exhibits negative differential transconductance characteristic that the drain current is first increased and then reduced at a specific gate voltage, when the gate voltage is increased by applying the back gate voltage of 20V to the device at room temperature (300K).

As described in detail in the above, the structure including the channel region having the high density of impurity and the gate having the length and width which can be reduced to several tens nanometers can be fabricated according to the present invention. Thus, a semiconductor device with negative differential conductance or transconductance at room temperature, which may function as a tunneling device according to the voltage applied thereto, can be implemented. Therefore, there is an advantage in that the present invention can be applied to an SRAM or a logic devic using a device which can be turned on/off in response to a specific voltage.

Further, according to the fabrication method of the present invention, the miniaturization of the device can be easily made, and the mass productivity of the device and the reproducibility of the process can be enhanced. Simultaneously, the gate, the source/drain regions and the channel region are formed by the self-aligned process. Thus, there is another advantage in that a gate pitch can also be reduced.

In addition, there is a further advantage in that the semiconductor device fabricated according to the present invention may have the characteristic of a single electron transistor by using the channel region as the quantum dot and the two P+-N+ junctions as the tunneling barriers.

Although the present invention has been described in connection with the preferred embodiments, it will be understood by those skilled in the art that various modifications and changes can be made within the scope and spirit of the present invention. It is also apparent that these modifications and changes are included in the appended claims.

What is claimed is:

1. A method of fabricating a semiconductor device with negative differential conductance or transconductance, comprising:

a first step of etching a single crystal silicon layer of an SOI substrate consisting sequentially of a silicon support, a buried oxide film and the single crystal silicon layer so as to form source and drain regions which are spaced apart from each other and a channel region which is connected with the source and drain regions and has a fine line width;

a second step of implanting impurity ions into the source, channel, and drain regions with their density being higher than the effective density of states at which electrons or holes can exist so that the channel is doped with the impurity ions;

a third step of forming a first insulation film on the source, channel and drain regions and the buried oxide film, and etching the first insulation film so as to form sidewall spacers on side surfaces of the source, channel and drain regions and then forming a second insulation film on the exposed silicon surface including the source, channel and drain regions so as to form a gate insulation film on the channel region;

a fourth step of depositing a gate material on the entire surface including the second insulation film and forming a gate having a fine line width in a direction normal to the channel region by etching the deposited gate material; and a fifth step of implanting impurity ions, having opposite polarity to that of the impurity ions implanted in the second step, into the source and drain regions.

2. The method as claimed in claim 1, wherein the impurity ions implanted in the second step are P-type impurity ions, and the impurity ions implanted in the fifth step are N-type impurity ions.

3. The method as claimed in claim 1, wherein the impurity ions implanted in the second step are N-type impurity ions, and the impurity ions implanted in the fifth step are P-type impurity ions.

4. The method as claimed in claim 2, wherein the P-type impurity ions are ones selected from the group consisting of B, $BF_2^+$ and In, and the N-type impurity ions are ones selected from the group consisting of $As_2^+$, As and P.

5. The method as claimed in claim 1, wherein the silicon single crystal at the first step and the gate material at the fourth step are etched with an E-beam lithography method or a fine patterning technique using sidewalls.

6. The method as claimed in claim 1, wherein the gate material at the fourth step is polycrystalline or amorphous silicon.

7. The method as claimed in claim 1, further comprising the step of, between the fourth and fifth steps, forming an insulation film for covering the entire surface including the source, gate and drain regions and the buried oxide film and etching the insulation film so as to form sidewall spacers in side surfaces of the gate.

8. The method as claimed in claim 1, wherein the material of the insulation film are ones selected from the group consisting of $SiO_2$ and SiN.

9. A method for fabricating a semiconductor device with negative differential conductance or transconductance, comprising:

a first step of etching the single crystal silicon layer of an SOI substrate consisting sequentially of a silicon support, a buried oxide film and the single crystal silicon layer so as to form source and drain regions which are spaced apart from each other and a channel region which is connected with the source and drain regions and has a fine line width;

a second step of implanting impurity ions into the source, channel and drain regions with their density being higher than the effective density of states at which electrons or holes can exist so that the source and drain regions are doped with the impurity ions;

a third step of forming a first insulation film on the source, channel and drain regions and the buried oxide film, and etching the first insulation film so as to form sidewall spacers of the source, channel and drain regions;

a fourth step of depositing a second insulation film on the entire surface including the source, channel and drain regions, the sidewall spacers and the buried oxide film, and exposing the channel region by etching the second insulation film in a direction normal to the channel region;

a fifth step of implanting impurity ions, having opposite polarity to that of the impurity ions implanted in the second step, into the channel region with their density being higher than the effective density of states; and a sixth step of depositing a gate insulation film on the channel region, and then forming a gate by depositing a gate material on the channel region and the gate insulation film.

10. The method as claimed in claim 9, wherein the sixth step further comprises the step of planarizing the deposited gate material.

11. The method as claimed in claim 10, wherein the planarizing process is an etchback process or a chemical mechanical polishing (CMP) process.

12. The method as claimed in claim 9, wherein the material of the first and second insulation film are ones selected from the group consisting of $SiO_2$ and SiN.

13. The method as claimed in claim 9, wherein the silicon single crystal at the first step and the gate material at the sixth step are etched with an E-beam lithography method or a fine patterning technique using sidewalls.

14. The method as claimed in claim 9, wherein the gate material deposited in the sixth step is polycrystalline or amorphous silicon.

15. The method as claimed in claim 3, wherein the P-type impurity ions are ones selected from the group consisting of B, $BF_2^+$ and In, and the N-type impurity ions are ones selected from the group consisting of $As_2^+$, As and P.

* * * * *